(12) United States Patent (10) Patent No.: US 12,614,596 B2
Liu et al. (45) Date of Patent: Apr. 28, 2026

(54) ENHANCED COMBINATION SCAN MANAGEMENT FOR BLOCK FAMILIES OF A MEMORY DEVICE

(71) Applicant: Micron Technology, Inc., Boise, ID (US)

(72) Inventors: Yang Liu, San Jose, CA (US); Steven Michael Kientz, Westminster, CO (US); Tingjun Xie, Milpitas, CA (US); Aaron Lee, Sunnyvale, CA (US); Jiangli Zhu, San Jose, CA (US); Wei Wang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 18/771,819

(22) Filed: Jul. 12, 2024

(65) Prior Publication Data

US 2025/0078939 A1 Mar. 6, 2025

Related U.S. Application Data

(60) Provisional application No. 63/536,064, filed on Aug. 31, 2023.

(51) Int. Cl.
*G11C 16/34* (2006.01)
*G11C 29/52* (2006.01)

(52) U.S. Cl.
CPC ...... *G11C 16/3418* (2013.01); *G11C 16/3404* (2013.01); *G11C 29/52* (2013.01)

(58) Field of Classification Search
CPC . G11C 16/3418; G11C 16/3404; G11C 29/52; G11C 2029/0409; G11C 16/0483; G11C 16/26; G11C 16/349

(Continued)

(56) References Cited

U.S. PATENT DOCUMENTS

| | | | | |
|---|---|---|---|---|
| 11,263,134 B1 * | 3/2022 | Sheperek | ............. | G11C 16/349 |
| 11,922,041 B2 * | 3/2024 | Kientz | ................. | G11C 29/028 |

(Continued)

FOREIGN PATENT DOCUMENTS

CN 112114752 A 12/2020

OTHER PUBLICATIONS

International Search Report and Written Opinion for International Application No. PCT/US2024/044823, mailed Dec. 9, 2024, 9 Pages.

*Primary Examiner* — Huan Hoang

(74) *Attorney, Agent, or Firm* — Lowenstein Sandler LLP

(57) ABSTRACT

An example memory sub-system includes a memory device and a processing device, operatively coupled to the memory device. The processing device is configured to initiate a scan operation on a plurality of block families of the memory device. Each of the plurality of block families is assigned to a voltage offset bin of a plurality of voltage offset bins. The processing device further determines that a number of scan operations to be performed in one scan interval is greater than a maximum number of scan operations to be performed in a scan interval. The processing device further determines based on the voltage offset bins of the plurality of block families and a time elapsed since execution of a previous scan operation of the plurality of block families, a scan priority of each of the plurality of block families, and schedules, based on the scan priority, a scan operation of one or more block families of the plurality of block families during one or more subsequent scan intervals. Based on the scan result, two or the plurality of block families which are scanned within the same or different intervals can be combined and thus release block family memory if their measurement results satisfy combining criterion.

20 Claims, 16 Drawing Sheets

(58) Field of Classification Search
USPC .................................................... 365/185.09
See application file for complete search history.

(56) References Cited

U.S. PATENT DOCUMENTS

| | | |
|---|---|---|
| 2017/0160338 A1 | 6/2017 | Connor et al. |
| 2019/0066739 A1 | 2/2019 | Muchherla et al. |
| 2022/0199187 A1 | 6/2022 | Rayaprolu et al. |
| 2023/0205442 A1 | 6/2023 | Nowell et al. |

* cited by examiner

100

HOST SYSTEM
120

MEMORY SUB-SYSTEM 110

MEMORY SUB-SYSTEM CONTROLLER 115

PROCESSOR 117

LOCAL MEMORY
119

BLOCK FAMILY
SCAN COMPONENT
113

MEMORY
DEVICE
140

MEMORY
DEVICE(S)
130

LOCAL MEDIA
CONTROLLER
135

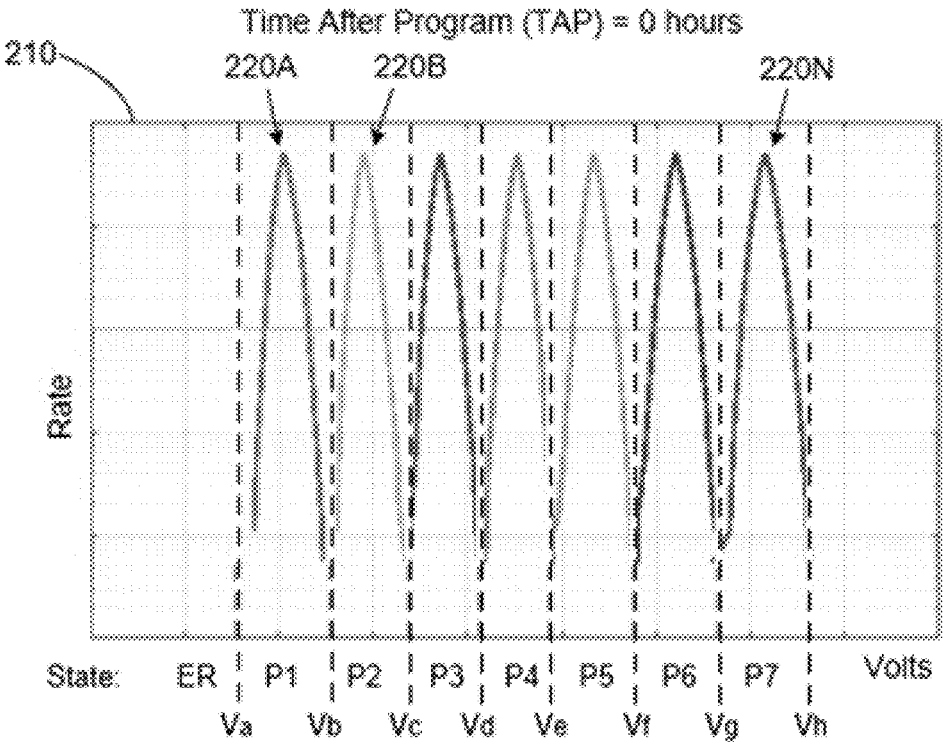
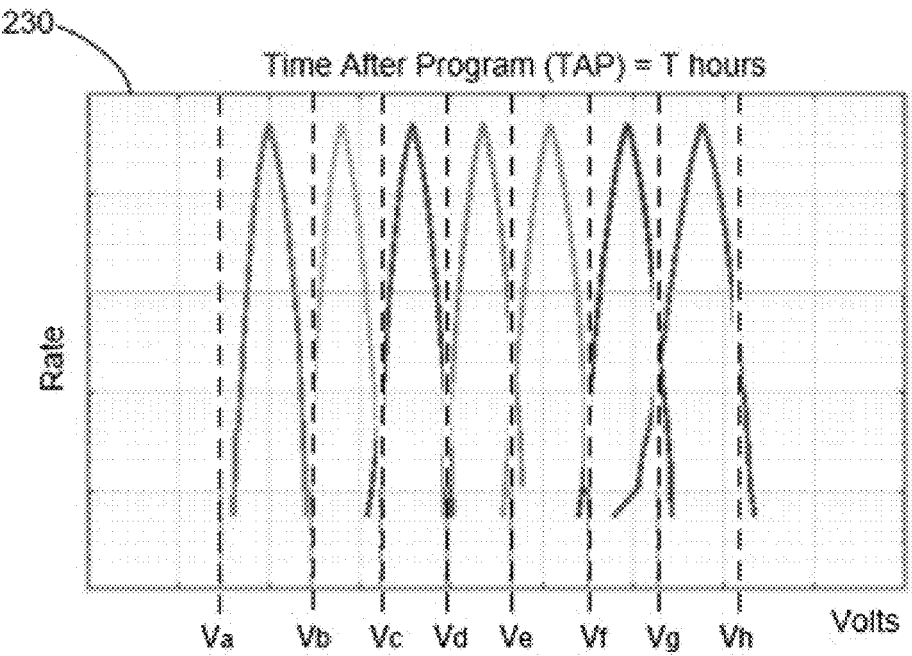
FIG. 2

1100

1102  1104  1106

| BF | Scan Priority 0: highest priority; 1/2/3/...: the larger the lower the priority; 0xFF: no need to scan (initial value) | Recently measured L7 Center Shift (DAC) 0xFF = Invalid | | | | |
|---|---|---|---|---|---|---|
| | | DF0 | DF1 | DF2 | DF3 | DF4 |
| 1 | 0 | -7 | -6 | -6 | -5 | -6 |
| 2 | 0 | -15 | -11 | -14 | -10 | -12 |
| 3 | 1 | 0xFF | 0xFF | 0xFF | 0xFF | 0xFF |
| 4 | 0xFF | 0xFF | 0xFF | 0XFF | 0xFF | 0xFF |

| Bin1 | Bin2 | Bin3 | Bin4 | Bin5 | Bin6 |
|---|---|---|---|---|---|
| 1 | 2 | 6 | 23 | 30 | 0xFF |

Scan count (unit of N); 0xFF: no need to scan

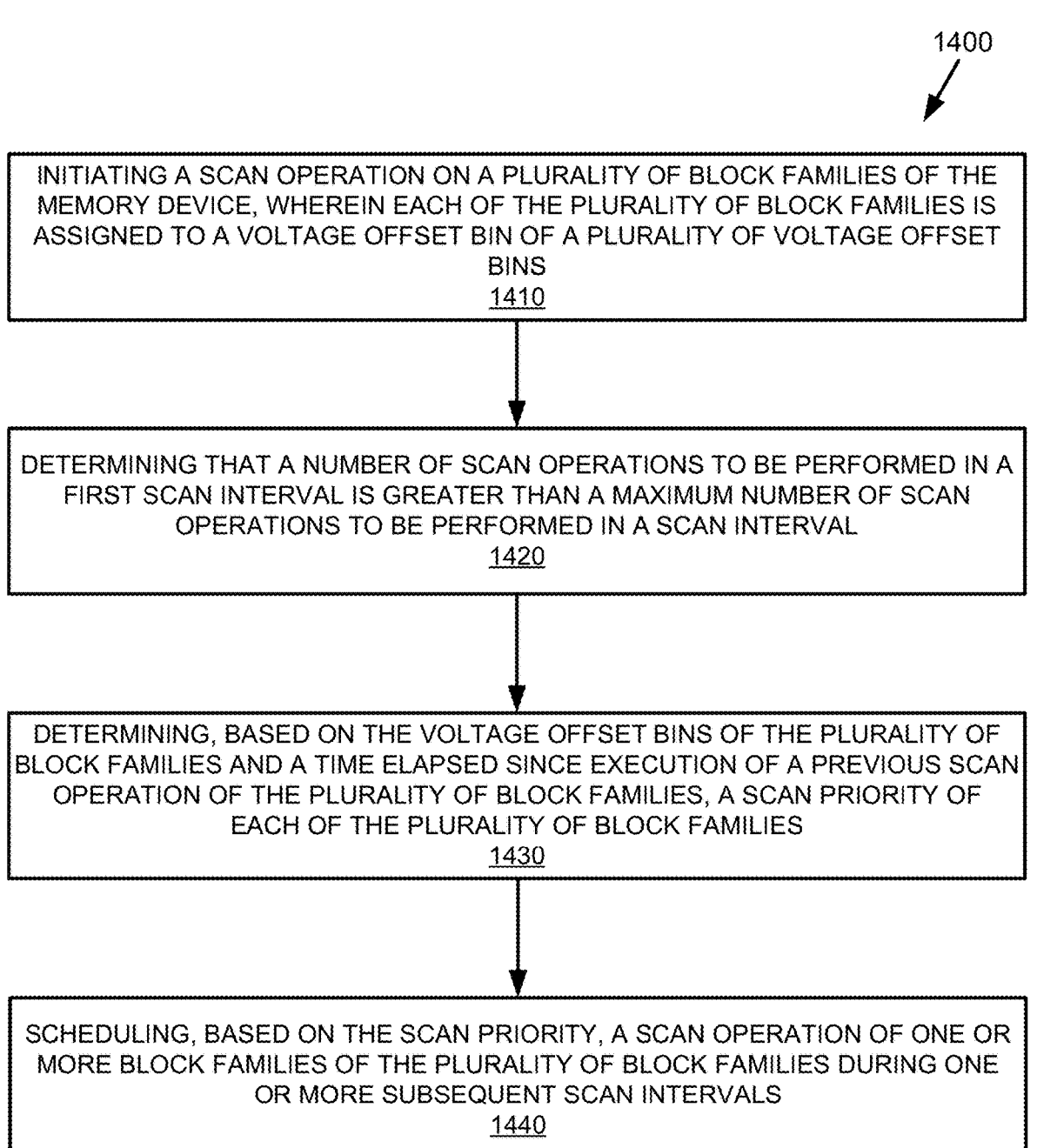

INITIATING A SCAN OPERATION ON A PLURALITY OF BLOCK FAMILIES OF THE MEMORY DEVICE, WHEREIN EACH OF THE PLURALITY OF BLOCK FAMILIES IS ASSIGNED TO A VOLTAGE OFFSET BIN OF A PLURALITY OF VOLTAGE OFFSET BINS
1410

DETERMINING THAT A NUMBER OF SCAN OPERATIONS TO BE PERFORMED IN A FIRST SCAN INTERVAL IS GREATER THAN A MAXIMUM NUMBER OF SCAN OPERATIONS TO BE PERFORMED IN A SCAN INTERVAL
1420

DETERMINING, BASED ON THE VOLTAGE OFFSET BINS OF THE PLURALITY OF BLOCK FAMILIES AND A TIME ELAPSED SINCE EXECUTION OF A PREVIOUS SCAN OPERATION OF THE PLURALITY OF BLOCK FAMILIES, A SCAN PRIORITY OF EACH OF THE PLURALITY OF BLOCK FAMILIES
1430

SCHEDULING, BASED ON THE SCAN PRIORITY, A SCAN OPERATION OF ONE OR MORE BLOCK FAMILIES OF THE PLURALITY OF BLOCK FAMILIES DURING ONE OR MORE SUBSEQUENT SCAN INTERVALS
1440

FIG. 14

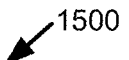

RESPONSIVE TO DETERMINING THAT A FIRST BLOCK FAMILY OF THE PLURALITY OF BLOCK FAMILIES AND A SECOND BLOCK FAMILY OF THE PLURALITY OF BLOCK FAMILIES SATISFY A COMBINING CRITERION, MERGING THE FIRST BLOCK FAMILY AND THE SECOND BLOCK FAMILY TO FORM A COMBINED BLOCK FAMILY
1510

GENERATING A COMBINATION MATRIX COMPRISING THE PLURALITY OF BLOCK FAMILIES AND RESPECTIVE DIFFERENCES IN THRESHOLD VOLTAGES BETWEEN THE PLURALITY OF BLOCK FAMILIES
1520

IDENTIFYING TWO OR MORE BLOCK FAMILIES HAVING A LOWEST DIFFERENCE IN THRESHOLD VOLTAGES BETWEEN THE BLOCK FAMILIES
1530

COMBINING THE IDENTIFIED TWO OR MORE BLOCK FAMILIES TO FORM THE COMBINED BLOCK FAMILY
1540

FIG. 15

ENHANCED COMBINATION SCAN MANAGEMENT FOR BLOCK FAMILIES OF A MEMORY DEVICE

RELATED APPLICATIONS

This application claims the benefit of priority from U.S. Provisional Application No. 63/536,064 filed Aug. 31, 2023, the entire contents of which are hereby incorporated by reference herein.

TECHNICAL FIELD

Embodiments of the disclosure are generally related to memory sub-systems, and more specifically, are related to combination scan management for block families of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 2 schematically illustrates the temporal voltage shift caused by the slow charge loss exhibited by triple-level memory cells, in accordance with some embodiments of the present disclosure.

FIG. 11 schematically illustrates example metadata maintained by the memory sub-system controller for assigning scan priorities to block families based on predetermined threshold voltage shifts (measured in Digital to Analog Conversions (DAC)) and a scan count of the block families, in accordance with embodiments of the present disclosure.

FIG. 14 is a flow diagram of an example method for scheduling scan operations in one or more scan intervals based on a maximum scan budget assigned to the scan intervals and a scan priority of each of the block families, in accordance with some embodiments of the present disclosure.

FIG. 15 is a flow diagram of an example method of performing a block family combination scan at a memory sub-system, in accordance with some embodiments of the present disclosure.

DETAILED DESCRIPTION

Figure 1:
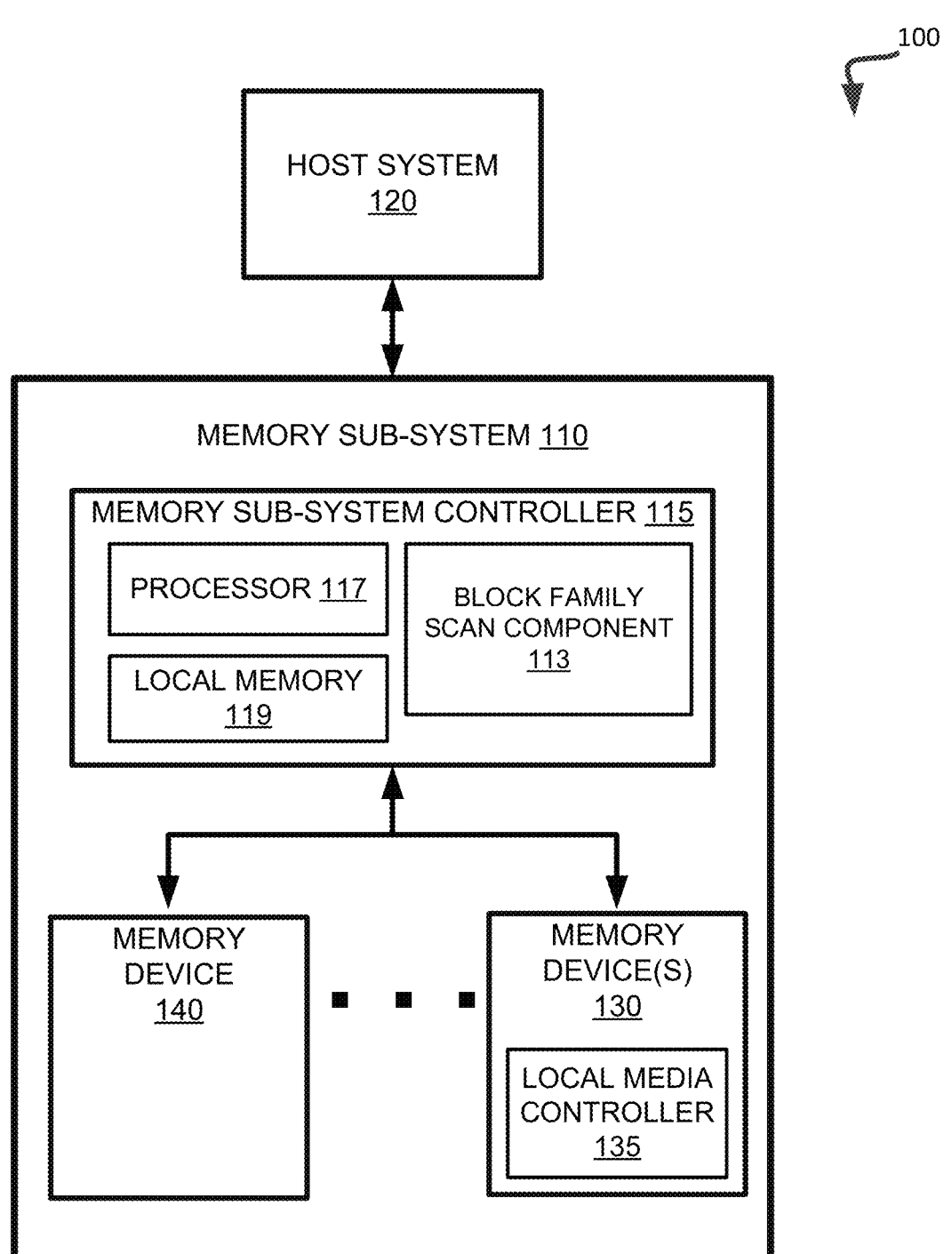
FIG. 1 illustrates an example computing system that includes a memory sub-system in accordance with some embodiments of the present disclosure.

Embodiments of the present disclosure are directed to combination scan management for block families of a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information.

Data operations can be performed by the memory subsystem. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows it to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system. "Block family" herein shall refer to a set of blocks that have been programmed within a specified time window and a specified temperature window. More specifically, the present disclosure addresses the ability to update voltage bin offset for each block family in a timely manner and combine two or more block families based on combination criterion by performing a scan process that can start and stop based on predefined conditions in order to efficiently maintain suitable read level to minimize bit error rate and manage the number of block families within the memory sub-system while minimizing the overhead of the scan process.

Block family error avoidance (BFEA) is used in some memory devices to track slow charge loss (SCL) for programmed blocks and for selecting the appropriate voltage bin offset at read time. For some memory devices, however, it may be difficult to track SCL for each superblock. Therefore, superblocks, with similar SCL progression profile are grouped together into a block family (BF). Each block family has a set of voltage bin offset assigned to it. Voltage bin offsets are assigned per die or per die family. It is important for BFEA to update voltage bin for each block family in time such that the SSD can maintain a satisfactory trigger rate or trigger margin. Such voltage bin updates are maintained by a block family scan which scans block families periodically and updates the voltage bin during runtime. The block family scan frequency depends on the current SCL condition and a system budget for background management. At the same time, a memory sub-system in a memory device has an upper bound on the number of block families it can maintain due to memory constraints. Therefore, it is important for a memory device to always maintain a reasonable number of block families such that force combining or blind combining block families to release block family memory is rarely triggered, which can result in trigger rate and trigger margin degradation.

During runtime, block families are scanned periodically to determine which voltage bin a block family belongs to, and the scan frequency depends on the current SCL condition of the block family. During one voltage bin scan, the oldest two block families are scanned and voltage bin offsets are updated for the scanned block families if needed. If the measurement from the two oldest block families within a voltage bin are close enough (e.g., within a threshold range), then they are combined to release memory. An example combination metric is shown below where BF_A and BF_B are the two oldest block families, LUNs in the memory devices are grouped into five die families which are denoted by $DF_i$ and L7 Centershift is the threshold voltage shift (measured in Digital to Analog Conversions (DAC)):

$$\max_{i\in\{0,1,2,3,4\}} \left| L7 \ \text{Centershift}_{\text{BF\_A},DF_i} - L7 \ \text{Centershift}_{\text{BF\_B},DF_i} \right| \leq \text{CombineTh}$$

When the number of block families and/or voltage bins to be scanned within one scan interval (e.g., 15 minutes) surpasses a threshold number, it may impact the performance and/or QoS of the memory device. Additionally, it may also cause a delay in the scan operation and/or voltage bin offset update. Therefore, appropriate scheduling of block family scans becomes even more important when there are more voltage bins and some methodologies may consider scanning more than two block families per voltage bin for more accurate read level calibration due to smaller read window budget (RWB). Some block family combination policies are based on the assumption that two oldest block families are scanned at the same time and there are at most two block families per voltage bin that need to be combined. However, if more block families are scheduled to be scanned and can be combined, then the block family combination policy may require an update.

In accordance with embodiments of the present disclosure, a block family scan process can be initiated upon detecting that a triggering condition for starting the scan process has been satisfied. In one example, the scan process can be initiated responsive to detecting that the number of free entries for new block families within a block family metadata table is below a certain threshold. In this case, the scan process can be stopped when the threshold number of free block family entries in the metadata table has been reached or exceeded. In another example, the scan process can be initiated responsive to determining that a predetermined time period has elapsed since the execution of a previous scan process. In some embodiments, before executing the scan process, the set of block families that can be scanned in the chronological order, from the newest (most recently created) block family to the oldest (least recently created) block family, in order to efficiently merge the new block families that are likely to meet the combination criterion early in the scan process.

During a scan process or at the end of a scan process when the host system receives the DAC results from each block family, it can iterate through the block families of the memory sub-system and determine whether any two or more block families satisfy one or more block family combination criterion. The block family combination criterion can be based on a data state metric determined for each block family, such that block families that have data state metrics that are within a predetermined variance of each other can be combined together. A data state metric of a block family can indicate the temporal voltage shift (TVS) of the blocks associated with the block family. TVS refers to the threshold voltage of a memory cell changes in time as the electric charge of the cell is degrading, which causes the voltage distributions to shift along the voltage axis towards lower voltage levels. Furthermore, the block family combination criterion can be updated (e.g., relaxed or tightened) based on the number of free entries available for storing new block families in a metadata table during the execution of the scan process, such that more or less block families can be combined based on the updated block family combination criterion.

In certain embodiments, the scan process can be terminated upon detecting that a certain terminating condition has been satisfied. As an example, the scan process can be terminated responsive to detecting that the number of free entries for new block families within the block family metadata table reached a certain threshold. In another example, the scan process can be terminated responsive to determining that the full set of block families of the memory sub-system has been scanned; thus the scan process naturally terminates since there are no more block families to scan. In yet another example, the terminating condition can be based on the demand and traffic from the host of the memory sub-system. For instance, when detecting that the number of memory access requests that are received from the host during the scan process exceed a certain threshold, the scan process can be stopped in order to enable the processing of the host requests, thus maintaining a high quality of service (QOS) of the memory sub-system.

In some embodiments, the memory sub-system may schedule block family scans by moving block family scan operations to neighboring scan intervals that have less scan operations to be performed such that the maximum block family scan operations per scan interval does not exceed a system budget. For example, for a voltage bin which currently has a large scan interval (e.g., bin4: 8 hours) when a scan operation is triggered, the block families within this voltage bin do not necessarily need to be scanned right away (e.g., scan urgency is lower compared with voltage bins which have much shorter scan cadence). Thus, delaying the scan operation for block families of voltage bin 4 for several scan intervals (e.g., 15 minutes) would not result in non-timely bin update but can help maintain the performance or the QoS of the memory device. Accordingly, the memory sub-system may prioritize scan operations in a queue based on the update urgency and the availability of slots in a scan interval.

In some embodiments, the memory sub-system may combine two or more block families, based on a voltage bin update, either from the same scan interval or from different scan intervals. The method includes performing a threshold voltage shift (measured in Digital to Analog Conversions (DAC)) measurement on each of the block families in a voltage bin. The next operation involves generating a DAC distance matrix mapping a DAC difference between each of the block families against other block families in the voltage bin. For example, cell [1, 2] would show a DAC difference between block family 1 and block family 2. The next operation involves comparing each of these DAC differences to a DAC combination threshold, and if the DAC difference is below a DAC combination threshold, then combining two or more block families with the same DAC difference to form a new distance matrix. This operation is repeated until there are no DAC differences below the DAC combination threshold.

Therefore, advantages of the systems and methods implemented in accordance with some embodiments of the present disclosure include, but are not limited to, improving the bit error rate in read operations by maintaining metadata tracking groups of blocks (block families) that are presumed to exhibit similar voltage distributions. Additionally, the present disclosure enables the ability to merge block families that have similar voltage distributions together by performing a combination scan process that can be start and stop based on configurable conditions in order to minimize any additional overhead on the memory sub-system. Additionally, the enhanced block family error avoidance periodic scan method addresses the performance and QoS concerns in existing periodic block family scan methods by scheduling the block families to be scanned during different scan intervals based on a voltage bin update priority and availability of the scan queue. The methods disclosed build upon the existing block family scan methodologies and introduces very limited memory and computational overhead. Other advantages include the ability to combine more than two block families per voltage bin which can be measured at different scan intervals based on the scan scheduling. Other advantages include the flexibility in adjusting scan frequency per voltage bin, the number of block families to scan per voltage bin, and the total number of voltage bins that can be scanned using the disclosed methods and systems, as described in more detail herein below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family scan component 113, which can be used to implement techniques for scanning block families within memory sub-system 110 in order to combine block families that satisfy a combination criterion, in accordance with embodiments of the present disclosure. In some embodiments, memory sub-system 110 can initiate a scan process to execute an algorithm to iterate through block families of memory sub-system 110, evaluate whether or not the voltage bin of a block family needs to be updated, two or more block families satisfy a block family combination criterion, and merge the two or more block families that satisfy the block family combination criterion. Memory sub-system 110 can schedule block family scans by moving block family scan operations to neighboring scan intervals that have less scan operations to be performed such that the maximum block family scan operations per scan interval does not exceed a system budget. For example, for a voltage bin which currently has a large scan interval (e.g., bin4: 8 hours) when a scan operation is triggered, the block families within this voltage bin do not necessarily need to be scanned right away (e.g., scan urgency is lower compared with voltage bins which have much shorter scan cadence). Thus, delaying the scan operation for block families of voltage bin 4 for several scan intervals (e.g., 15 minutes) would not impact the performance or the QoS of the memory device. Accordingly, the memory sub-system 110 may prioritize scan operations in a queue based on the update urgency and the availability of slots in a scan interval.

In certain embodiments, block family scan component 113 can schedule block family scans by moving block family scan operations to neighboring scan intervals that have less scan operations to be performed such that the maximum block family scan operations per scan interval does not exceed a system budget. In another example, block family scan component 113 can start the scan process upon determining that a time-based condition has been met (e.g., starting the scan process periodically when a predetermined time period elapses since execution of a previous scan process). In certain implementations, the predetermined time period can be updated based on the temperature of memory sub-system 110 or can be received from a host of memory sub-system 110.

During the scan process, block family scan component 113 can iterate through the block families and determine whether any two or more block families satisfy a block family combination criterion. The block family combination criterion can be based on a data state metric determined for each block family, such that block families that have data state metrics that are within a predetermined variance of each other can be combined together. A data state metric of a block family can indicate the temporal voltage shift (TVS) of the blocks associated with the block family. In certain implementations, the block family combination criterion can be updated during the execution of the scan process, such that more or less block families are combined based on the updated block family combination criterion. In another example, block family scan component 113 can combine two or more block families, based on a voltage bin update, either from the same scan interval or from different scan intervals. The block family scan component 113 can perform a threshold voltage shift (DAC) measurement on each of the block families in a voltage bin. The block family scan component 113 can generate a DAC distance matrix mapping a DAC difference between each of the block families against other block families in the voltage bin. For example, cell [1, 2] would show a DAC difference between block family 1 and block family 2. The block family scan component 113 can then compare each of these DAC differences to a DAC combination threshold, and if the DAC difference is below a DAC combination threshold, then combining two or more block families with the same DAC difference to form a new distance matrix. This operation is repeated until there are no DAC differences below the DAC combination threshold.

In one example, combining two block families together can refer to merging the blocks of the first block family into the second block family, then deleting the first block family. In another example, combining two block families can refer to creating a new block family and merging the blocks of each of the two block families into the new block family and then deleting the two block families. In some implementations, block family scan component 113, before executing the scan process, can determine a scan priority of the block families and schedule scanning of the block families based on an availability of a slot in a scan interval. In some implementations, block family scan component 113 may move a less priority block family to a later scan interval and similarly move a high priority block family to a current scan interval.

In certain embodiments, block family scan component 113 can terminate the scan process upon detecting that a certain terminating condition for ending the scan process has been satisfied. In order to maintain a high quality of service (QOS), block family scan component 113 can minimize the duration of the scan process so that the memory sub-system can dedicate its resources and bandwidth to host operations. As an example, block family scan component 113 can terminate the scan process upon detecting that a DAC combination threshold has been met. In another example, block family scan component 113 can terminate the scan process when the full set of block families has been scanned. In yet another example, block family scan component 113 can terminate the scan process based on the demand and traffic from the host of the memory sub-system 110. As an example, if the memory sub-system detects high demand (e.g., many memory access requests) from the host, block family scan component 113 can stop the scan process in order to initiate the processing of host requests, thus maintaining a high QoS of the memory sub-system.

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of charts 210 and 230 illustrate program voltage distributions 220A-420N (also referred to as "program distributions" or "voltage distributions" or "distributions" or "levels" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The read threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is the primary driver of TVS (temporal voltage shift). TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from X to Y minutes or hours after program). A time slice can be referenced by its center point.

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
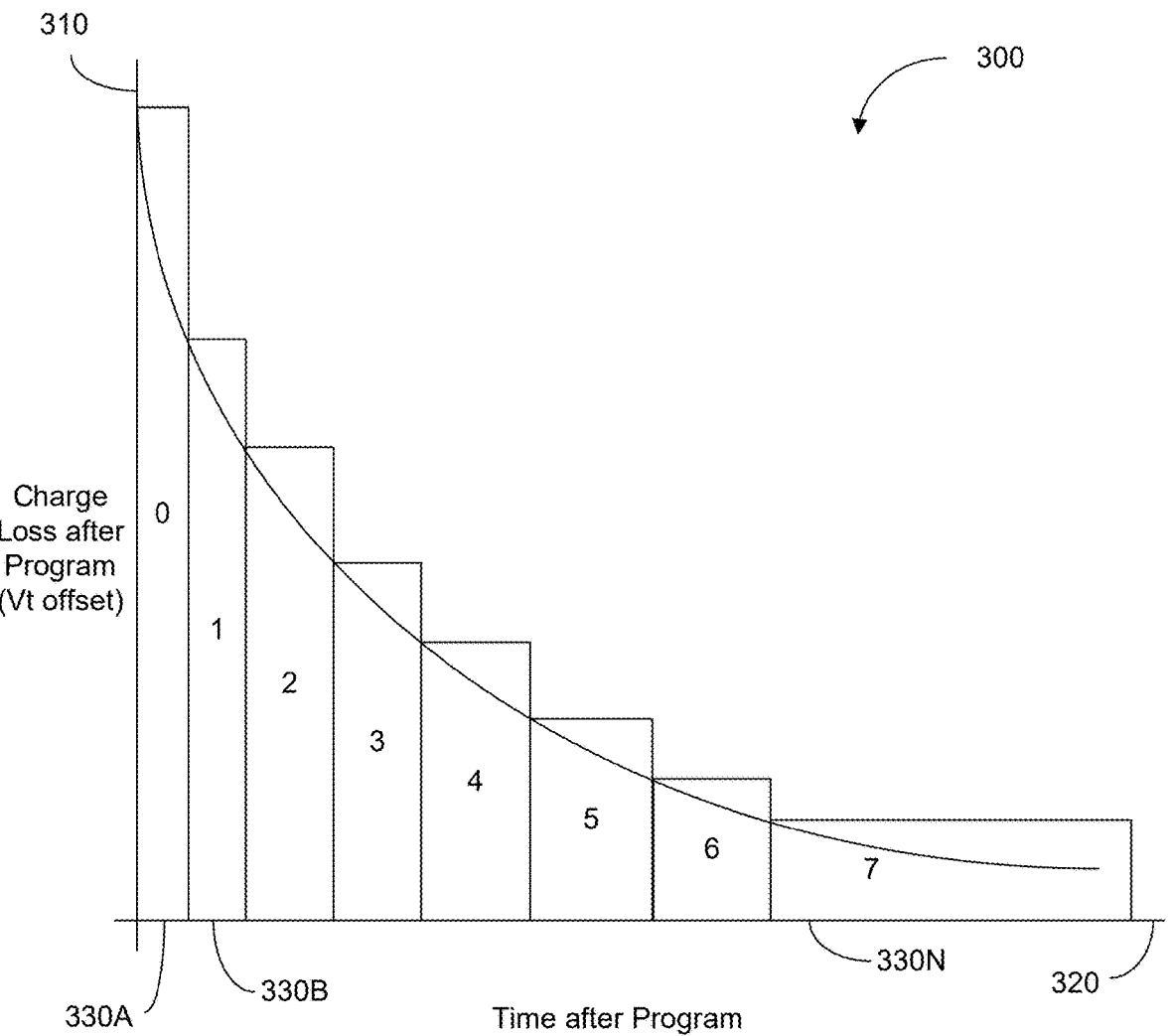
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph 300 illustrating the dependency of the threshold voltage offset 310 on the time after program 320 (i.e., the period of time elapsed since the block had been programmed. As schematically illustrated by FIG. 3, blocks of the memory device are grouped into block families 330A-330N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family 310 are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration process in order to associate each die of every block family with one of the predefines threshold voltage offset bins (bins 0-7 in the illustrative example of FIG. 3), which is in turn associated with the voltage offset to be applied for read operations. The associations of blocks with block families and block families and dies with threshold voltage offset bins can be stored in respective metadata tables maintained by the memory sub-system controller.

Figure 4:
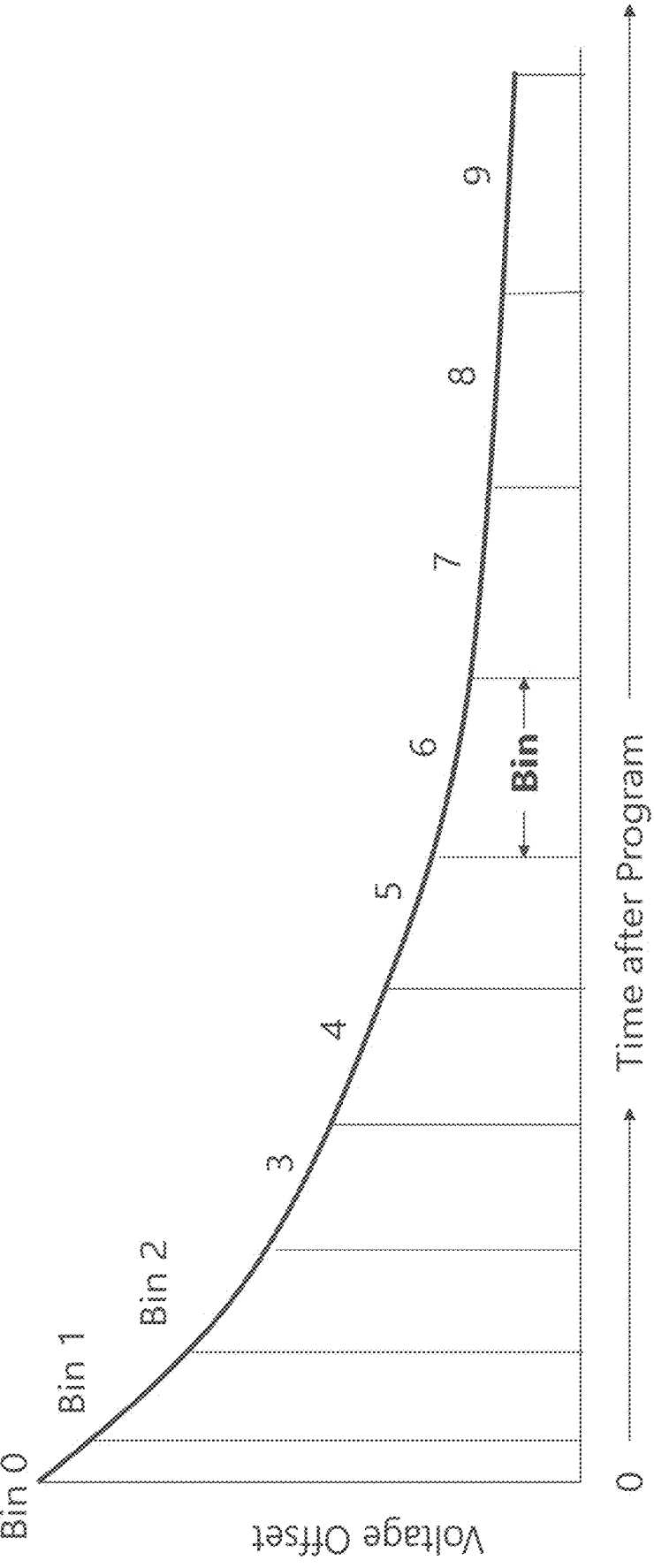
FIG. 4 schematically illustrates a set of predefined threshold voltage offset bins, in accordance with embodiments of the present disclosure.

FIG. 4 schematically illustrates a set of predefined threshold voltage offset bins (e.g., bin 0 to bin 9), in accordance with embodiments of the present disclosure. As schematically illustrated by FIG. 4, the threshold voltage offset graph can be subdivided into multiple threshold voltage offset bins, such that each bin corresponds to a predetermined range of threshold voltage offsets. While the illustrative example of FIG. 4 defines ten bins, in other implementations, various other numbers of bins can be employed (e.g., 7 bins). Based on a periodically performed calibration process, the memory sub-system controller associates each die or die family of every block family with a threshold voltage offset bin, which defines a set of threshold voltage offsets to be applied to the base voltage read level in order to perform read operations, as described in more detail herein below.

Figure 5:
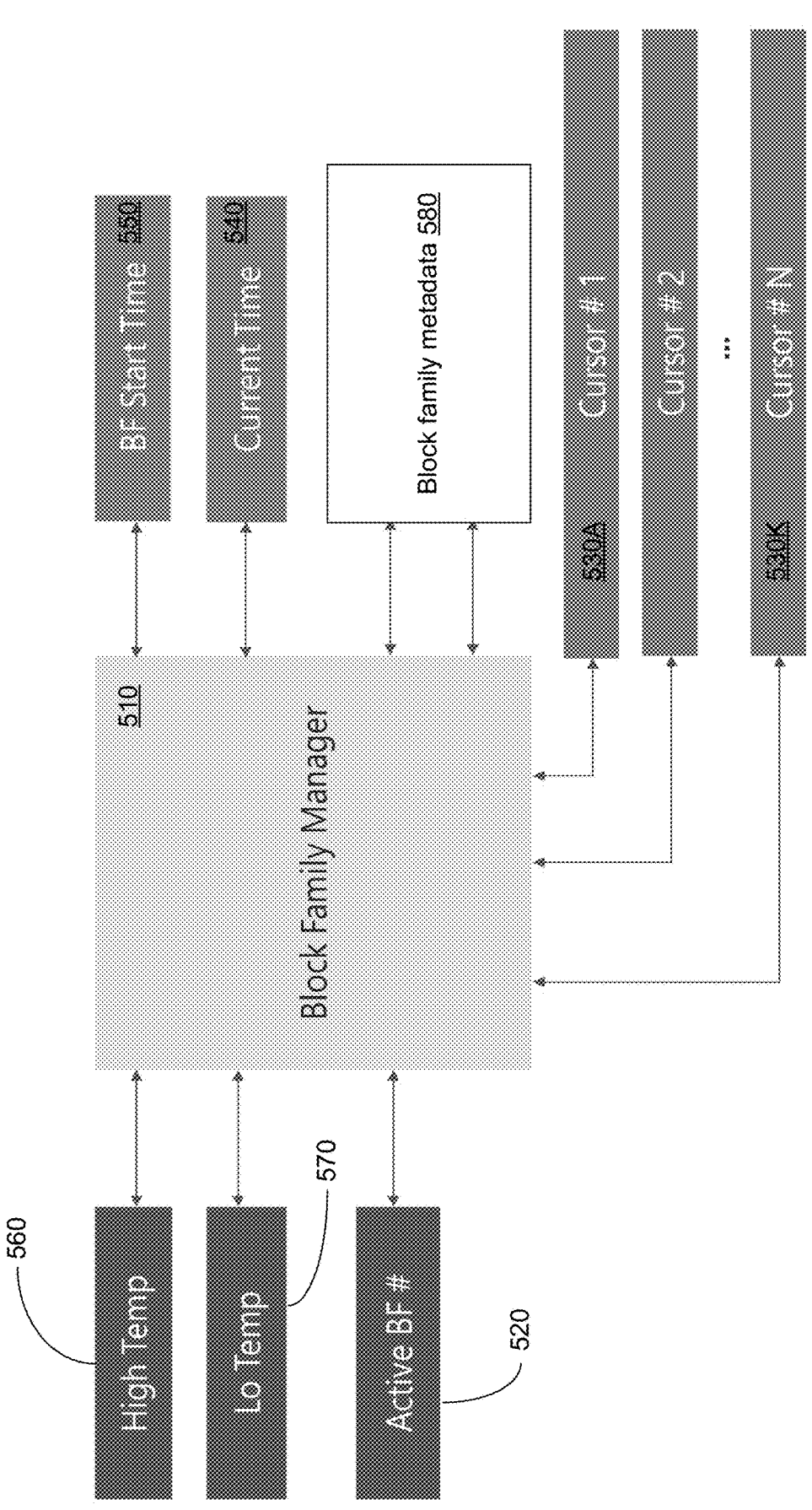
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, the memory sub-system controller associates the block with the currently active block family. The association of each block with a corresponding block family is reflected by the block family metadata 580, as described in more detail herein below with reference to FIG. 7.

As noted herein above, based on a periodically performed calibration process, the memory sub-system controller associates each die of every block family with a threshold voltage offset bin, which defines a set of threshold voltage offsets to be applied to the base voltage read level in order to perform read operations. The calibration process involves performing, with respect to a specified number of randomly selected blocks within the block family that is being calibrated, read operations utilizing different threshold voltage offsets, and choosing the threshold voltage offset that minimizes the error rate of the read operation.

Figure 6:
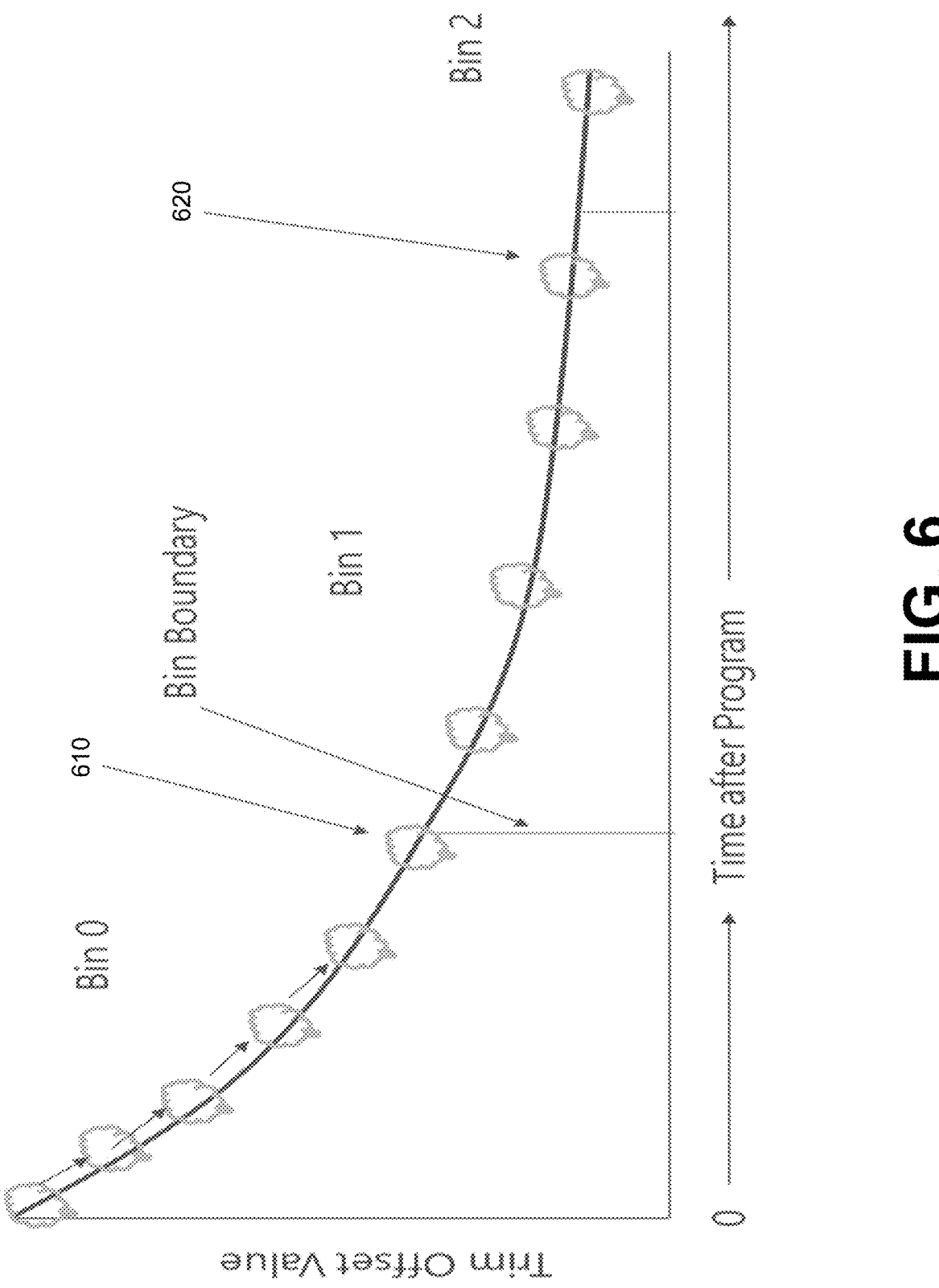
FIG. 6 schematically illustrates selecting block families for calibration, in accordance with embodiments of the present disclosure.

FIG. 6 schematically illustrates selecting block families for calibration, in accordance with embodiments of the present disclosure. As schematically illustrated by FIG. 6, the memory sub-system controller can limit the calibration operations to the oldest block family in each bin (e.g., block family 610 in bin 0 and block family 620 in bin 1), since it is the oldest block family that will, due to the slow charge loss (SCL), migrate to the next bin before any other block family of the current bin.

Figure 7:
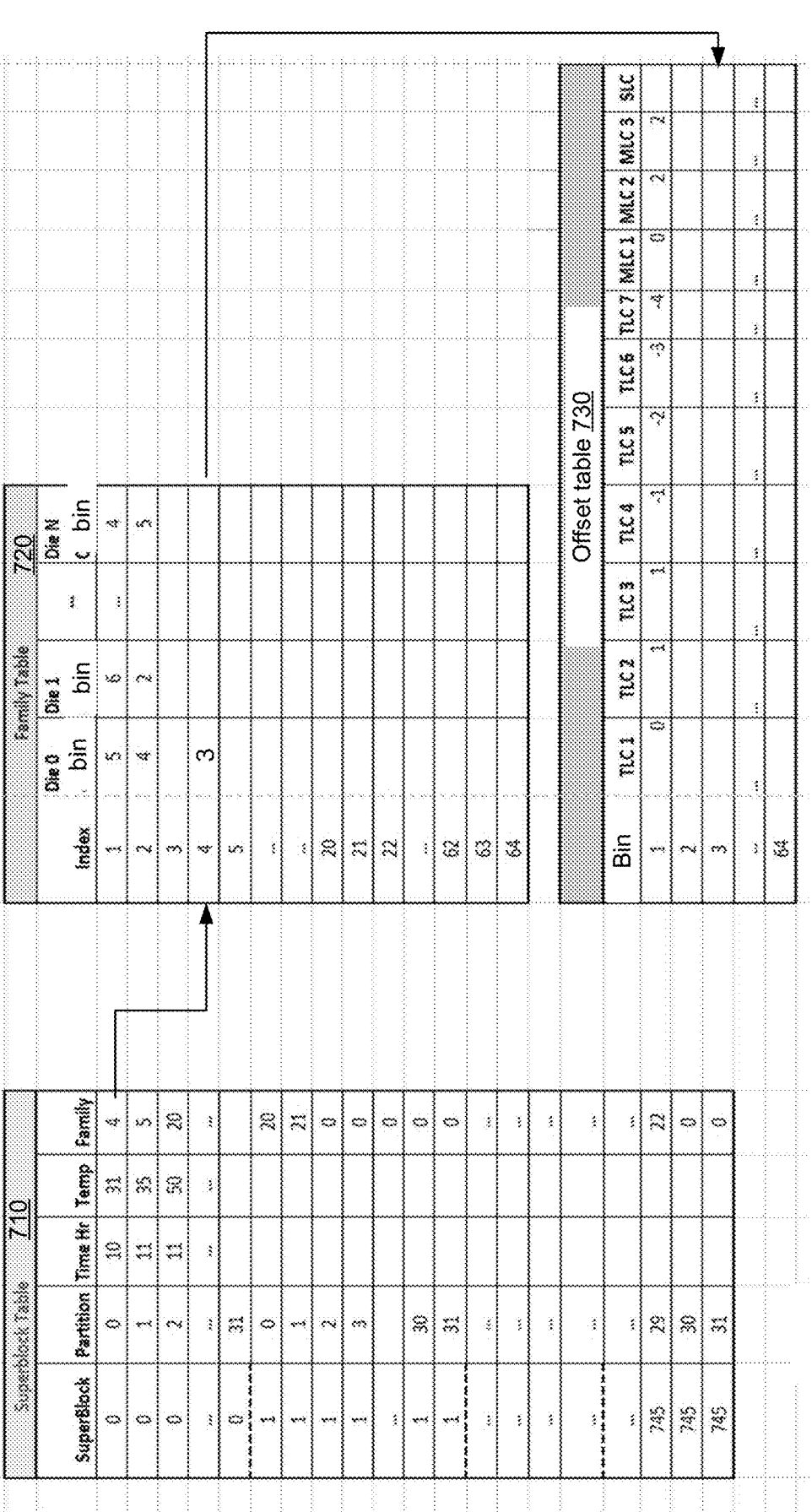
FIG. 7 schematically illustrates example metadata maintained by the memory sub-system controller for associating blocks and/or partitions with block families, in accordance with embodiments of the present disclosure.

FIG. 7 schematically illustrates example metadata maintained by the memory sub-system controller for associating blocks and/or partitions with block families, in accordance with embodiments of the present disclosure. As schematically illustrated by FIG. 7, the memory sub-system controller can maintain the superblock table 710, the family table 720, and the offset table 730.

Each record of the superblock table 710 specifies the block family associated with the specified superblock and partition combination. In some implementations, the superblock table records can further include time and temperature values associated with the specified superblock and partition combination.

The family table 720 is indexed by the block family number, such that each record of the family table 720 specifies, for the block family referenced by the index of the record, a set of threshold voltage offset bins associated with respective dies of the block family. In other words, each record of the family table 720 includes a vector, each element of which specifies the threshold voltage offset bin associated with the die referenced by the index of the vector element. The threshold voltage offset bins to be associated with the block family dies can be determined by the calibration process, as described in more detail herein above.

Finally, the offset table 730 is indexed by the bin number. Each record of the offset table 730 specifies a set of threshold voltage offsets (e.g., for TLC, MLC, and/or SLC) associated with threshold voltage offset bin.

The metadata tables 710-730 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 710 is used to identify the block family identifier corresponding to the physical block number; then, the block family identifier is used as the index to the family table 720 in order to determine the threshold voltage offset bin associated with the block family and the die; finally, the identified threshold voltage offset bin is used as the index to the offset table 730 in order to determine the threshold voltage offset corresponding to the bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the family table 720 in order to determine that die 0 is mapped to bin 3. The latter value is used as the index to the offset table in order to determine the threshold voltage offset values for bin 3.

Figure 8:
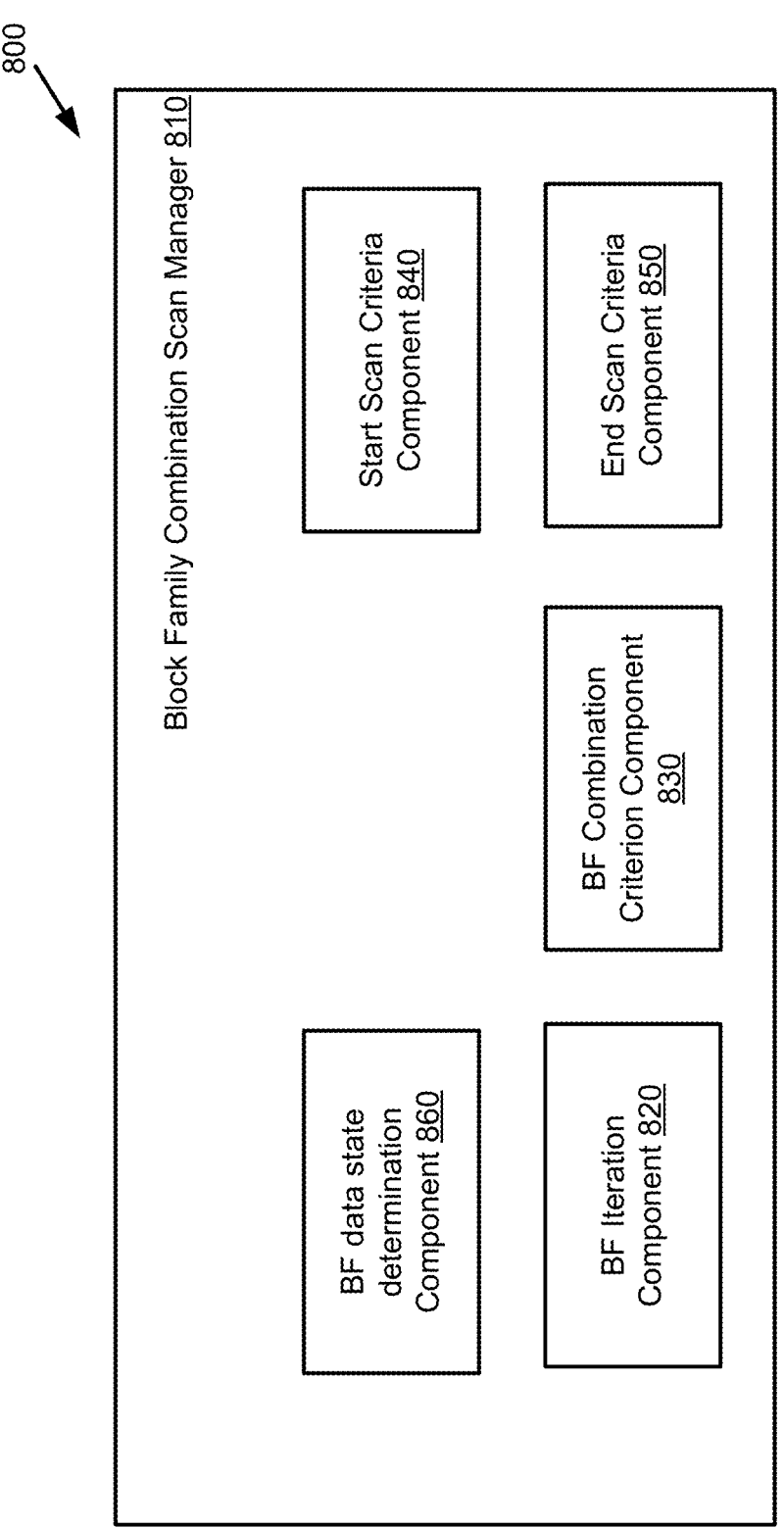
FIG. 8 is a block diagram illustrating the components of the block family scan component of the memory sub-system, operating in accordance with embodiments of the present disclosure.

FIG. 8 is a block diagram illustrating the components of the block family scan component of the memory sub-system, operating in accordance with embodiments of the present disclosure. As illustrated in FIG. 8, block family combination scan manager 810 can include block family (BF) iteration component 820 for managing the process of iterating through block families during a scan process, BF combination criterion component 830 for managing and updating the combination criterion of block families during a scan process, start scan criteria component 840 for managing the criterion for starting a scan process, end scan criteria component 850 for managing the criterion for stopping a scan process, and BF data state determination component 860 for determining data state metrics for block families during the scan process.

Block family combination scan manager 810 can be the same or similar to block family scan component 113 of FIG. 1. In some implementations, block family combination scan manager 810 can initiate a scan process to iterate through the block families of the memory sub-system to update bin selection for block families during which combining two or more block families based on a predetermined block family combination criterion can happen. In certain implementations, block family combination scan manager 810 can combine two or more block families together by selecting one of the two or more block families, merging the blocks of the two or more block families into the selected block family, and deleting the merged block families while maintaining the selected block family. In another implementation, block family combination scan manager 810 can combine two or more block families by creating a new block family, merging the blocks of each of the two or more block families into the new block family and then deleting the two or more block families. In certain implementations, the memory sub-system can maintain a block family metadata table for tracking blocks association to block families, among other block family metadata. In this case, after merging two block families together, block family combination scan manager 810 can update an entry in the block family metadata table to reflect the new association of blocks to the target block family. Additionally, block family combination scan manager 810 can delete entries from the block family metadata table associated with block families that no longer have blocks associated to them after the merge.

In one implementation, prior to attempting to merge block families during a scan process, block family combination scan manager 810 can also perform bin selection (i.e., assigning block families to bins and/or moving block families from one bin to another based on changes of volt thresholds associated with each block family) during the scan process.

Start scan criteria component 840 can manage the criteria for starting a scan process. In one implementation, start scan criteria component 840 can initiate a scan process upon detecting that a certain condition for starting the scan process has been satisfied. As an example, start scan criteria component 840 can start the scan process upon detecting that the number of free entries for new block families within a block family table is below a certain threshold (e.g., free block family entries are less than 20 entries). In this case, in order to allow more free entries to be available in the block family table, start scan criteria component 840 can start the scan process to merge two or more block families into a single block family, thus freeing more space in the block family table. In another example, start scan criteria component 840 can start the scan process upon determining that a time-based condition has been met. For example, block start scan criteria component 840 can start the scan process periodically when a predetermined time period elapses (e.g., start a scan process every 24 hours, from a power-up time of the memory sub-system). In certain implementations, the predetermined time period can be updated based on the temperature of memory sub-system 110 (e.g., if the temperature is higher than average, the time period to run a scan periodically can be shorter, such that the scan process runs more frequently than the frequency of the scan process under an average temperature). In yet another example, start scan criteria component 840 can receive the time period for periodically initiating a scan process from a host of the memory sub-system.

BF iteration component 820 can manage the process of iterating through block families during a scan process. During the scan process, BF iteration component 820 can iterate through the block families and determine whether any two or more block families satisfy a block family combination criterion. In certain implementations, BF iteration component 820 can scan the set of block families in a chronological order, from the newest (most recently created) block family to the oldest (least recently created) block family. Newly created block families are likely to have data state metrics that are similar to each other (e.g., TVS value of each block family is close to the TVS value of the next block family), whereas older block families are likely to have different date state metrics (e.g., TVS values are far apart). Therefore, BF iteration component 820 can more efficiently consider the new block families early in the scanning process before scanning the old block families that are less likely to be combined. BF iteration component 820 can select the set of block families that will be scanned regardless of the bin for which the block families are assigned (e.g., block families that are assigned to different bins can be scanned and combined).

BF combination criterion component 830 can manage and update the combination criterion of block families during a scan process. Block family combination criterion can be used to determine whether any two or more block families can be merged together. The block family combination criterion can be based on a data state metric, as determined by BF data state determination component 860, for each block family, such that block families that have data state metrics that are within a predetermined variance of each other can be combined together. In certain implementations, BF combination criterion component 830 can update the block family combination criterion during the execution of the scan process, such that more or less block families can be combined together based on the updated block family combination criterion. For example, when BF combination criterion component 830 detects that the free entries available for new block families in a metadata table is significantly low, BF combination criterion component 830 can relax the combination criterion, such that more block families can be combined together, thus freeing more block family entries. As an example, block families with data state metrics within 7 DACs, instead of the default value of 3 DACs, can be combined together, thus combining more block families and generating free entries faster in the block family metadata tables.

End scan criteria component 850 can manage the criterion for terminating a scan process. In some implementations, end scan criteria component 850 can terminate the scan process upon detecting that a certain condition for stopping the scan process has been satisfied. In one implementation, end scan criteria component 850 can terminate the scan process upon detecting that the number of free entries for new block families within a block family metadata table reached a certain threshold (e.g., free block family entries are more than 30 entries). In another implementation, end scan criteria component 850 can terminate the scan process when the full set of block families has been scanned (e.g., this can be the case when the memory sub-system is in an idle time where QoS can be minimal). In yet another implementation, end scan criteria component 850 can terminate the scan process based on an amount of demand from the host of the memory sub-system 110. As an example, end scan criteria component 850 can be notified that the memory sub-system queued a number of requests from the host that were received while the scan process is in progress. In this case, if the number of requests in the queue reaches a certain threshold, end scan criteria component 850 can terminate the scan process in order to initiate the processing of the queued host requests, thus maintaining a high QoS of the memory sub-system.

BF data state determination component 860 can determine data state metrics for block families during the scan process. The data state metric can be used by the block family combination criterion in determining whether to merge two block families, such that block families that have data state metrics that are within a predetermined variance of each other can be combined together. A data state metric of a block family can indicate the temporal voltage shift (TVS) of the blocks associated with the block family. As an example, for any two block families, if the data state metric of one block family is within 3 units of Digital to Analog Conversion (DAC) s from the data state metric of the other block family, then the two block families can be combined together.

Figure 9:
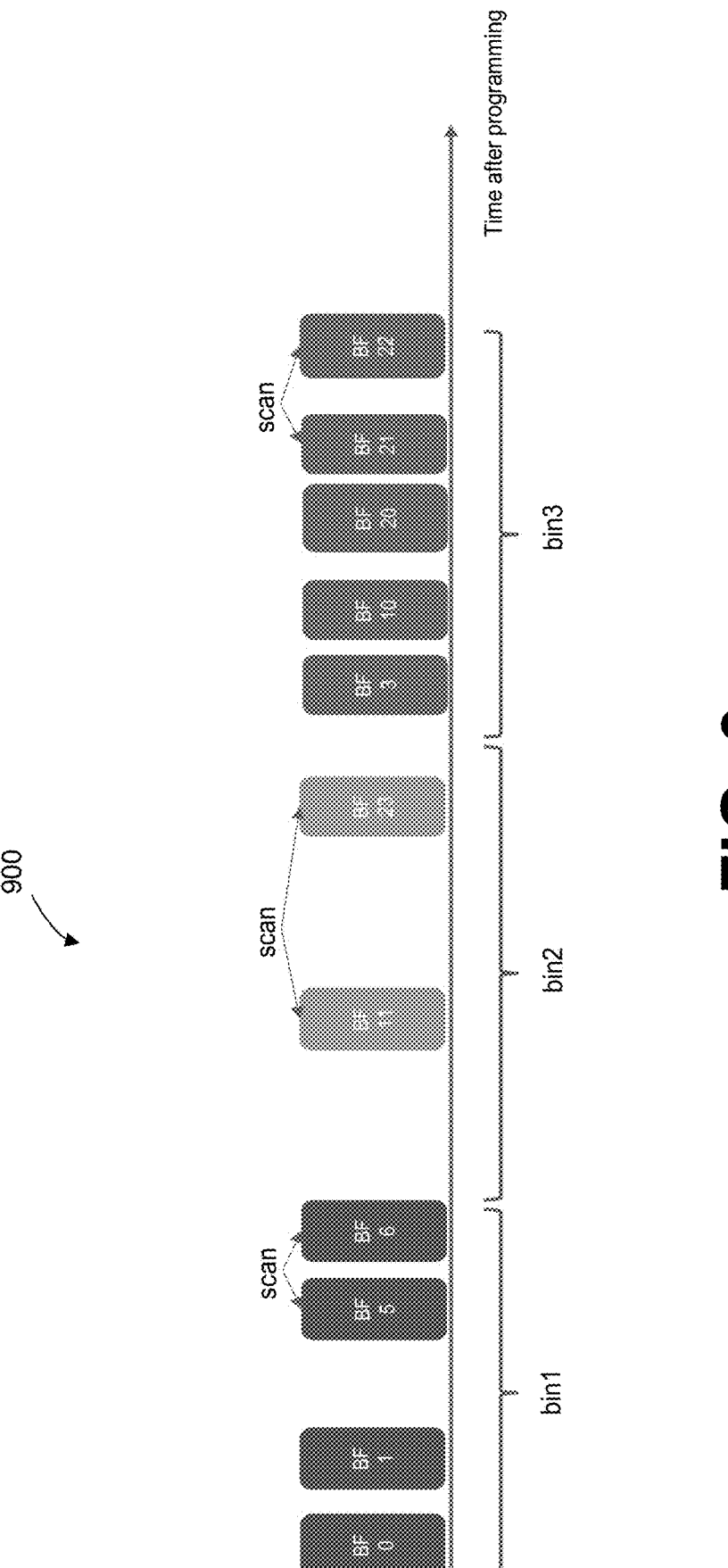
FIG. 9 illustrates an example method for scanning the oldest two block families in a voltage bin, in accordance with embodiments of the present disclosure.

FIG. 9 illustrates an example method 900 for scanning block families in a voltage bin, in accordance with embodiments of the present disclosure. In some implementations, the memory sub-system controller 150 of FIG. 1 may scan two of the oldest block families in each of the voltage bins. For example, BF 5 and BF 6 in voltage bin 1 may be given priority because they are the oldest block families (e.g., based on time after programming) in voltage bin 1. Similarly, BF 11 and BF 23 in voltage bin 2 may be given priority because they are the oldest block families in voltage bin 2, and BF 21 and BF 22 in voltage bin 3 may be given priority because they are the oldest block families in voltage bin 3, and so and so forth. However, there may be some block families whose data state metric (e.g., TVS) may have shifted in the meantime, and may need priority over the oldest block families in the voltage bin.

Figure 10:
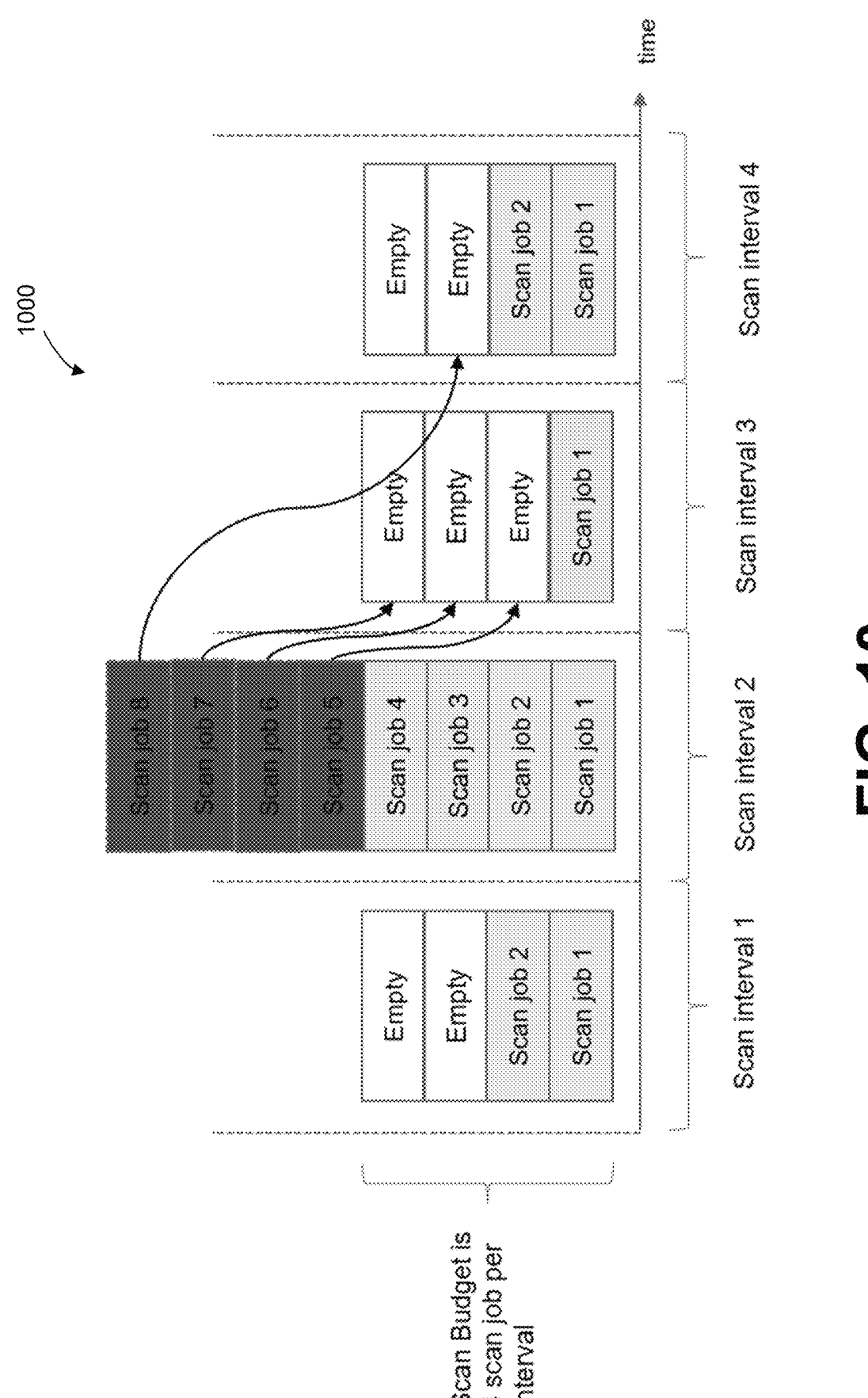
FIG. 10 illustrates an example method for scheduling scan operations in one or more scan intervals based on a maximum scan budget assigned to the scan intervals and a scan priority of each of the block families, in accordance with embodiments of the present disclosure.

FIG. 10 illustrates an example method 1000 for scheduling scan operations in one or more scan intervals based on a maximum scan budget assigned to the scan intervals and a scan priority of each of the block families, in accordance with embodiments of the present disclosure. In some implementations, the scan operations on block families may be spread over several scan intervals. However, each scan interval has a fixed scan budget. For example, in the implementation illustrated in FIG. 10, each scan interval has a maximum scan budget of 4, which means that the memory sub-system controller can only perform 4 scan operations in each interval, and performing any additional scan operations in a scan interval may affect the performance and/or QoS of the memory sub-system. In some instances, the memory sub-system controller may receive a request for additional scan operations that are beyond the scan budget of that interval. For example, in scan interval 2, the memory sub-system controller has received a request for 8 scan operations. In such cases, the memory sub-system controller may prioritize scan operations based on a scan priority of each of the block families, and therefore, move or schedule scan operation of lesser priority block families to a later or subsequent scan interval. In one example, the memory sub-system controller may move scan operations 5-7 to scan interval 3 because scan interval 3 has only 1 scheduled scan operation, and therefore can accommodate 3 additional scan operations within that scan interval. Additionally, since scan operation 8 is of the least priority between scan operations 5-8, it may be moved to scan interval 4, which only has two scheduled scan operations. By doing so, the memory sub-system controller ensures operation of the memory sub-system within the maximum scan budget assigned to each scan interval, thereby avoiding any impact to the performance and/or QoS of the memory sub-system.

FIG. 11 schematically illustrates example metadata 1100 maintained by the memory sub-system controller for assigning scan priorities to block families 1102 based on predetermined threshold voltage shift (measured in units of DAC) 1106 and a scan count 1108 of the block families, in accordance with embodiments of the present disclosure. Each block family 1102 is assigned a scan priority 1104 based on the recently measured L7 CenterShift (DAC) (SCL condition) as well as the number of scan intervals elapsed since this block family needs to be scanned. For example, block families 1 and 2 have a DAC value of 30 or more, and are therefore assigned the scan priority number of 3 which is defined as the distance between current time and the time one block family must be scanned (thus, the smaller the scan priority number, the higher the scan urgency). Each scan interval elapses after scan is triggered for block families 1 and 2 but not performed, scan priority number will be increased which implies higher scan urgency. The scan priorities 1104 assigned in this metadata are used by the memory sub-system controller in FIG. 10 to decide which scan operation is to be performed first. For example, if scan interval 2 has 8 scan operations, and the maximum scan budget is only 4, then the memory sub-system controller may move 4 of the scan operations, based on scan priority 1104, to later or subsequent scan intervals. Which of the scan operations are moved to a later scan interval can be determined based on the scan priority of each of the block families in that scan interval.

Figure 12:
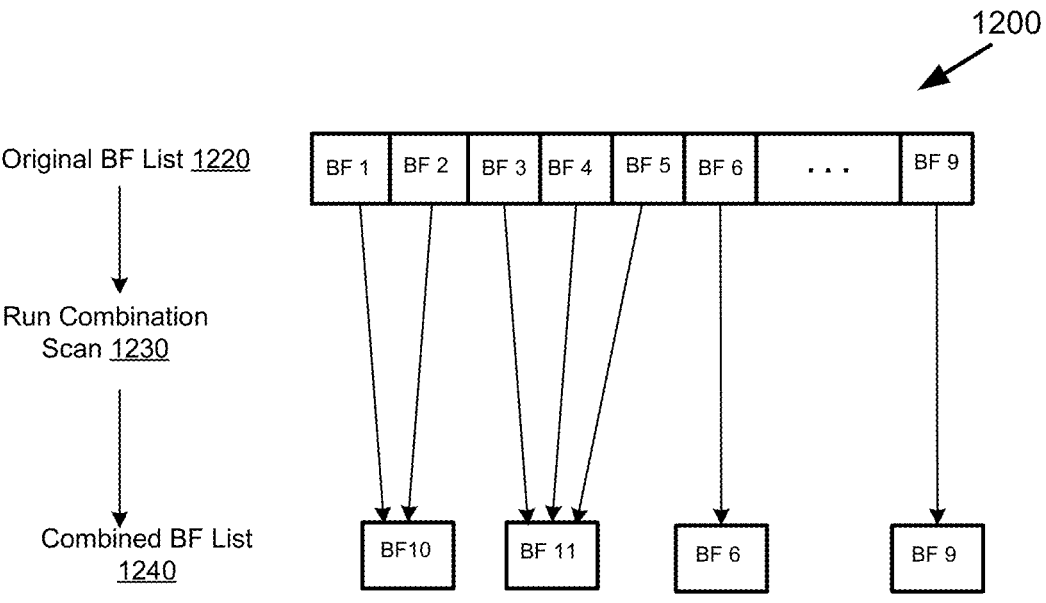
FIG. 12 depicts an example method of combining two or more block families by running a combination scan process on a list of block families, in accordance with some embodiments of the present disclosure.

FIG. 12 depicts an example method of merging two or more block families by running aa combination scan process on a list of block families, in accordance with some embodiments of the present disclosure. The method 1200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1200 is performed by block family scan component 113 of FIG. 1.

Original BF list 1220 can be a list of block families that are selected to be scanned at a given point in time. Original BF list 1220 can include block families BF 1-9 before a scan process is initiated. In certain implementations, original BF list 1220 can be ordered from newest to oldest before initiating the scan process, such that newer block families that have frequently changing threshold voltages can be scanned and potentially merged before scanning the older block families. Accordingly, the list of block families BF 1-9 can be an ordered list of block families where BF 1 is the newest block family (i.e., most recently created) and BF 9 is the oldest block family (i.e., created before all the other block families). Additionally, BF 1-9 can be assigned to the same bin or to different bins within the memory sub-system.

At operation 1230, the processing logic runs a combination scan process on original BF list 1220. In implementations, the processing logic can determine whether or not two of more blocks of BF 1-9 satisfy a block family combination criterion in order to be merged together. During the scan process 1230, the processing logic can determine that BF 1 and BF 2 satisfy the block family combination criterion, and consequently can merge block from BF 1 and blocks from BF 2 into BF 10. As an illustrative example, the processing logic can determine that a data state metric of BF 1 is within 3 DACs from a data state metric of BF 2, which satisfies the block family combination criterion. The processing logic can then merge BF 1 and BF 2 into BF 10. In one implementation, BF 10 can be a new block family that is created in a block family metadata table for the purpose of containing blocks from BF 1 and BF 2. In this case, BF 1 and BF 2 can be deleted after the merge. In another implementation, BF 10 can refer to BF 1, in which case blocks from BF 2 can be merged into BF 1 and BF 2 can be deleted after the merge.

Similarly, scan process 1230 can determine that BF 3, BF 4, and BF 5 each has a data state metric that satisfies a block family combination criterion, and can merge BF 3, BF 4, and BF 5 into BF 11. As an illustrative example, the processing logic can decide to merge BF 3, BF 4, and BF 5 into BF 11 upon determining that a data state metric of BF 3, a data state metric of BF 4, and a data state metric of BF 5 are all within 3 DACs from each other, which satisfies the block family combination criterion. In another example, the processing logic can determine that a data state metric of BF 3 and a data state metric of BF 5 are within 3 DACs from each other and can be combined. Given that the list of block families BF 1-9 is ordered, the processing logic can conclude that BF 4 can also be combined with BF 3 and BF 5 in one block family. And can thus combine blocks from BF 3, BF 4, and BF 5 into BF 11.

As scan process 1230 continue to scan block families 1220 in order, scan process can scan BF 6 and determines that no other block family is within the block family combination criterion with BF 6. Scan process 1230 can then move to the next BF without merging BF 6 with another block family. Similarly, scan process 1230 can consider BF 9, e.g., by determining a data stat metric of BF 9. Scan process 1230 can determine that no other block family within original BF list 1220 satisfy a block family combination criterion with BF 9. Scan process can then proceed to scanning the next block family, if any, without merging BF 9 with another block family. When scan process stops, e.g., because every block family in original BF list 1220 have been scanned, the memory sub-system can have combined BF list 1240 that include combined as well as original block families based on the scan results. In this case, combined BF list 1230 can include BF 10, BF 11, BF 6, and BF 9.

Figure 13:
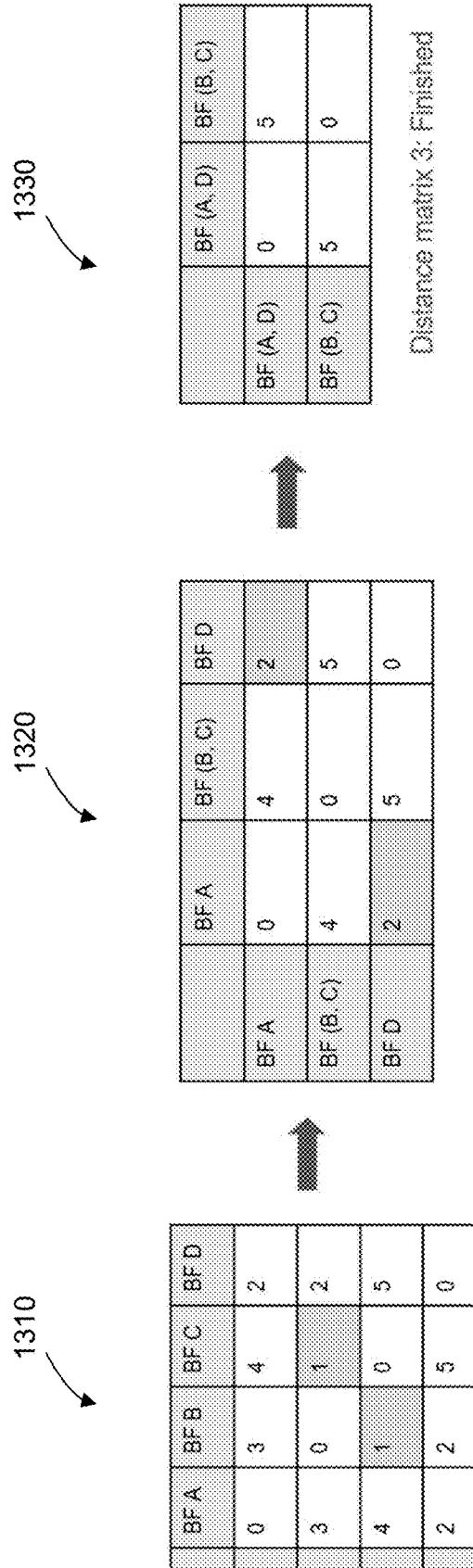
FIG. 13 depicts an example method of combining two or more block families based on a DAC distance matrix mapping a DAC difference between each of the block families against other block families in the voltage bin, in accordance with some embodiments of the present disclosure.

FIG. 13 depicts an example method of combining two or more block families based on a DAC distance matrix mapping a DAC difference between each of the block families against other block families in the voltage bin, in accordance with some embodiments of the present disclosure. In some implementations, the method for combining two or more block families, based on a voltage bin update, either from the same scan interval or from different scan intervals, can be performed by the memory sub-system controller. For example, at operation 1310 the memory sub-system controller may perform a threshold voltage shift (DAC) measurement on each of the block families (e.g., BF A-D) in a voltage bin. Then the memory sub-system controller may generate a DAC distance matrix mapping a DAC difference between each of the block families against other block families in the voltage bin. For example, cell [1, 2] would show a DAC difference between block family 1 and block family 2, cell [1, 3] would show a DAC difference between block family 1 and block family 3, so on and so forth. The memory sub-system controller then compares each of these DAC differences to a DAC combination threshold, and if the DAC difference is below a DAC combination threshold, then the memory sub-system controller combines two or more block families with the same DAC difference to form a new distance matrix. For example, at operation 1310, BF B and BF C have a DAC difference of 1, which is lesser than a DAC combination threshold of 3. Therefore, the memory sub-system controller combines BF B and BF C to generate a new distance matrix at operation 1320. At operation 1320, BF A and BF D have a DAC difference of 2, which is lesser than a DAC combination threshold of 3. Therefore, the memory sub-system controller combines BF A and BF D to generate a new distance matrix at operation 1330. This operation is repeated until there are no DAC differences below the DAC combination threshold. For example, at operation 1330, all block families have a DAC difference of 5, and therefore no combinations are performed by the memory sub-system controller.

FIG. 14 is a flow diagram of an example method of performing a block family combination scan at a memory sub-system, in accordance with some embodiments of the present disclosure. The method 1400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1400 is performed by the block family scan component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1410, the processing logic initiates a scan process on block families of the memory sub-system. The block families can be assigned to one or more bins within the memory sub-system. As discussed in more details herein above, initiating the scan process can be responsive to determining that a condition related to starting the scan process has been satisfied (e.g., a predetermined period of time has elapsed since the execution of a previous scan process). Each of the block families may be assigned to a voltage offset bin of a plurality of voltage offset bins.

At operation 1420, the processing logic determines that a number of scan operations to be performed in a current scan interval is greater than a maximum number of scan operations that can be performed in the current scan interval. For example, the host system may request 8 scan operations in a specific scan interval. However, the scan budget for that scan interval may be only 4 scan operations. In this example, the processing logic may determine that the maximum scan budget of the current scan interval is 4 and the number of scan operations requested in the current scan interval is 8.

At operation 1430, the processing logic may determine, based on the voltage bin of the block families and a time elapsed since execution of a previous scan operation of the block families, a scan priority of each of the block families. The scan priority may be determined similar to the scan priority 1104 discussed in FIG. 11. In one example, the scan priority of a block family may be based on the voltage bin to which the block family belongs and the time since the last scan operation was performed on the block family. In some implementations, the scan priority may be revised based on a recent DAC measurement as discussed in FIG. 11.

At operation 1440, the processing logic may schedule, based on the scan priority, a scan operation of one or more block families during one or more subsequent scan intervals. In one example, if scan interval 2 has 8 scan operations, and the maximum scan budget is only 4, then the processing logic may move 4 of the scan operations, based on scan priority, to later or subsequent scan intervals. The scan operations to be moved to a later scan interval can be determined based on the scan priority of each of the block families in that scan interval.

In an alternate embodiment, the processing logic may initiate a scan operation on the block families, where each of the block families is assigned to a voltage bin. The processing logic may then determine, based on the voltage bins of the block families and a time elapsed since execution of a previous scan operation of the block families, a scan priority of each of the block families. In the next operation, the processing logic may determine that a number of scan operations to be performed in a first scan interval is greater than a maximum number of scan operations to be performed in a scan interval. In a next operation, the processing logic may schedule, based on the scan priority, a scan operation of one or more block families during one or more subsequent scan intervals.

FIG. 15 is a flow diagram of an example method of performing a block family combination scan upon determining a scan priority in a block family metadata table of a memory sub-system, in accordance with some embodiments of the present disclosure. The method 1500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1500 is performed by the block family scan component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1510, the processing logic may determine that a first block family and a second block family satisfy a combining criterion (e.g., the DAC difference is within a threshold range). If the combining criterion is satisfied, the processing logic may merge the first block family and the second block family to form a combined or new block family. At operation 1520, the processing logic may do so by generating a combination matrix including block families and their respective differences in threshold voltages between the block families. At operation 1530, the processing logic may identify two or more block families having a lowest difference in threshold voltages between the block families. Alternatively, the processing logic may identify block families that have a DAC difference within a threshold range, which may be set by the host system. At operation 1540, the processing logic may combine the identified two or more block families to form a combined block family. The processing logic may then determine that a terminating condition has been satisfied, and then terminate the combining process. In one example, the terminating condition may be that there are no block families with DAC difference less than a threshold value set by the host system. In another example, the terminating condition may be that a predetermined number of block families have been combined, which would trigger a terminating condition.

In some implementations, the method for combining two or more block families, based on a voltage bin update, either from the same scan interval or from different scan intervals, can be performed by the processing logic. For example, the processing logic may perform a threshold voltage shift (DAC) measurement on each of the block families (e.g., BF A-D) in a voltage bin. Then the processing logic may generate a DAC distance matrix mapping a DAC difference between each of the block families against other block families in the voltage bin. For example, cell [1, 2] would show a DAC difference between block family 1 and block family 2, cell [1, 3] would show a DAC difference between block family 1 and block family 3, so on and so forth. The processing logic then compares each of these DAC differences to a DAC combination threshold, and if the DAC difference is below a DAC combination threshold, then the processing logic combines two or more block families with the same DAC difference to form a new distance matrix. For example, at operation 1310, BF B and BF C have a DAC difference of 1, which is lesser than a DAC combination threshold of 3. Therefore, the processing logic combines BF B and BF C to generate a new distance matrix. Since BF A and BF D have a DAC difference of 2, which is lesser than a DAC combination threshold of 3. Therefore, the processing logic combines BF A and BF D to generate a new distance matrix. This operation is repeated until there are no DAC differences below the DAC combination threshold. For example, if all block families have a DAC difference of 5, and therefore no combinations are performed by the processing logic.

Figure 16:
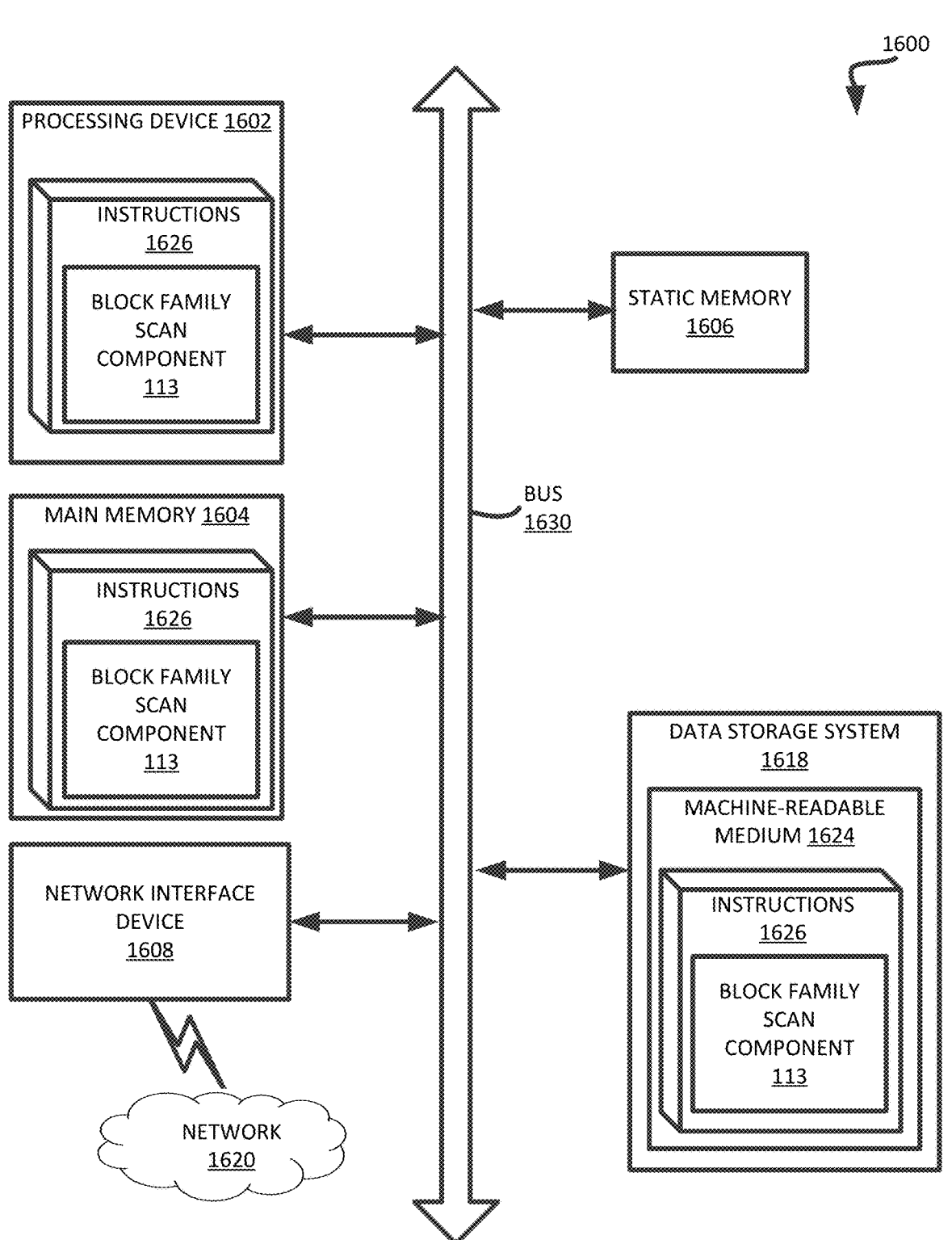
FIG. 16 is a block diagram of an example computer system in which embodiments of the present disclosure can operate.

FIG. 16 illustrates an example machine of a computer system 1600 within which a set of instructions, for causing the machine to perform any one or more of the methodologies discussed herein, can be executed. In some embodiments, the computer system 1600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to block family scan component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1600 includes a processing device 1602, a main memory 1604 (e.g., read-only memory (ROM), flash memory, dynamic random access memory (DRAM) such as synchronous DRAM (SDRAM) or Rambus DRAM (RDRAM), etc.), a static memory 1606 (e.g., flash memory, static random access memory (SRAM), etc.), and a data storage system 1618, which communicate with each other via a bus 1630.

Processing device 1602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1602 can also be one or more special-purpose processing devices such as an application specific integrated circuit (ASIC), a field programmable gate array (FPGA), a digital signal processor (DSP), network processor, or the like. The processing device 1602 is configured to execute instructions 1626 for performing the operations and steps discussed herein. The computer system 1600 can further include a network interface device 1608 to communicate over the network 1620.

The data storage system 1618 can include a machine-readable storage medium 1624 (also known as a computer-readable medium) on which is stored one or more sets of instructions 1626 or software embodying any one or more of the methodologies or functions described herein. The instructions 1626 can also reside, completely or at least partially, within the main memory 1604 and/or within the processing device 1602 during execution thereof by the computer system 1600, the main memory 1604 and the processing device 1602 also constituting machine-readable storage media. The machine-readable storage medium 1624, data storage system 1618, and/or main memory 1604 can correspond to the memory sub-system 110 of FIG. 1.

In one embodiment, the instructions 1626 include instructions to implement functionality corresponding to block family scan component 113 of FIG. 1. While the machine-readable storage medium 1624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, the processing device is to perform operations comprising:
   initiating a scan operation on a plurality of block families of the memory device, wherein each of the plurality of block families is assigned to a respective voltage offset bin of a plurality of voltage offset bins;
   determining that a number of scan operations to be performed in a first scan interval is greater than a maximum number of scan operations to be performed in a scan interval;
   determining, based on the voltage offset bins of the plurality of block families and a time elapsed since execution of a previous scan operation of the plurality of block families, a scan priority of the plurality of block families; and
   scheduling, based on the scan priority, a scan operation of one or more block families of the plurality of block families during one or more subsequent scan intervals.

2. The system of claim 1, wherein the operations further comprise:
   responsive to determining that a first block family of the plurality of block families and a second block family of the plurality of block families satisfy a combining criterion, merging the first block family and the second block family to form a combined block family.

3. The system of claim 2, wherein the operations further comprise:

generating a combination matrix comprising the plurality of block families and respective differences in threshold voltages between the plurality of block families;
identifying two or more block families having a lowest difference in threshold voltages between the block families;
combining the identified two or more block families to form the combined block family; and
responsive to determining that a terminating condition has been satisfied, terminating the combining.

4. The system of claim 3, wherein determining that the terminating condition has been satisfied comprises determining that the lowest difference in threshold voltages between the two or more block families is greater than or equal to a predetermined threshold voltage shift (DAC).

5. The system of claim 1, wherein the plurality block families are ordered from newest block families to oldest block families.

6. The system of claim 3, wherein the operations further comprise:
   updating the combining criterion based on a number of free block family entries within a metadata table, during execution of the scan operation, wherein more or less block families are combined based on the updated combining criterion.

7. The system of claim 1, wherein the operations further comprise:
   updating voltage offset bin assignments of one or more block families of the plurality of block families.

8. The system of claim 2, wherein the combining criterion is updated during execution of the scan operation.

9. The system of claim 2, wherein the combining criterion is based on a data state metric of each block family of the plurality of block families.

10. A method comprising:
Initiating a scan operation on a plurality of block families of a memory device, wherein each of the plurality of block families is assigned to a respective voltage offset bin of a plurality of voltage offset bins;
determining, based on the voltage offset bins of the plurality of block families and a time elapsed since execution of a previous scan operation of the plurality of block families, a scan priority of the plurality of block families;
determining that a number of scan operations to be performed in a first scan interval is greater than a maximum number of scan operations to be performed in a scan interval; and
scheduling, based on the scan priority, a scan operation of one or more block families of the plurality of block families during one or more subsequent scan intervals.

11. The method of claim 10, further comprising:
responsive to determining that a first block family of the plurality of block families and a second block family of the plurality of block families satisfy a combining criterion, merging the first block family and the second block family to form a combined block family.

12. The method of claim 11, further comprising:
generating a combination matrix comprising the plurality of block families and respective differences in threshold voltages between the plurality of block families;
identifying two or more block families having a lowest difference in threshold voltages between the block families;
combining the identified two or more block families to form the combined block family; and responsive to determining that a terminating condition has been satisfied, terminating the combining operation.

13. The method of claim 12, wherein determining that the terminating condition has been satisfied comprises determining the lowest difference in threshold voltages between the two or more block families is greater than or equal to a predetermined threshold voltage shift (DAC).

14. The method of claim 11, wherein merging the first block family and the second block family further comprises:

assigning blocks of the second block family to the first block family; and deleting an entry associated with the second block family from a metadata table.

15. The method of claim 11, wherein merging the first block family and the second block family further comprises:

adding, to a metadata table, a metadata item referencing a new block family;

assigning blocks of the first block family and blocks of the second block family to the new block family; and deleting entries associated with the first block family and the second block family from the metadata table.

16. A non-transitory computer-readable storage medium comprising instructions that, when executed by a processing device, cause the processing device to:

initiate a scan operation on a plurality of block families of a memory device, wherein each of the plurality of block families is assigned to a respective voltage offset bin of a plurality of voltage offset bins;

determine that a number of scan operations to be performed in a first scan interval is greater than a maximum number of scan operations to be performed in a scan interval;

determine, based on the voltage offset bins of the plurality of block families and a time elapsed since execution of a previous scan operation of the plurality of block families, a scan priority of the plurality of block families; and schedule, based on the scan priority, a scan operation of one or more block families of the plurality of block families during one or more subsequent scan intervals.

17. The non-transitory computer-readable storage medium of claim 16, wherein the processing device is further to:

merge a subset of the plurality of block families into a single block family, responsive to determining that the subset of the plurality of block families satisfy a combining criterion, the subset of block families comprising two or more block families.

18. The non-transitory computer-readable storage medium of claim 17, wherein the processing device is further to:

generating a combination matrix comprising the plurality of block families and respective differences in threshold voltages between the plurality of block families;

identifying two or more block families having a lowest difference in threshold voltages between the block families;

combining the identified two or more block families to form the single block family; and responsive to determining that a terminating condition has been satisfied, terminating the combining process.

19. The non-transitory computer-readable storage medium of claim 18, wherein determining that the terminating condition has been satisfied comprises determining the lowest difference in threshold voltages between the two or more block families is greater than or equal to a predetermined threshold voltage shift (DAC).

20. The non-transitory computer-readable storage medium of claim 16, wherein the plurality block families are ordered from newest block families to oldest block families.

* * * * *